US012207521B2

(12) United States Patent
Zhu (10) Patent No.: US 12,207,521 B2
(45) Date of Patent: Jan. 21, 2025

(54) DISPLAY PANEL AND DISPLAY DEVICE (71) Applicant: Wuhan China Star Optoelectronics Semiconductor Display Technology Co., Ltd., Wuhan (CN)

(72) Inventor: Qiwen Zhu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/620,776

(22) PCT Filed: Dec. 8, 2021

(86) PCT No.: PCT/CN2021/136427
§ 371 (c)(1),
(2) Date: Dec. 20, 2021

(87) PCT Pub. No.: WO2023/097717
PCT Pub. Date: Jun. 8, 2023

(65) Prior Publication Data
US 2024/0032377 A1 Jan. 25, 2024

(30) Foreign Application Priority Data
Nov. 30, 2021 (CN) .......................... 202111441657.8

(51) Int. Cl.
*H10K 59/38* (2023.01)
*H10K 59/35* (2023.01)
(Continued)

(52) U.S. Cl.
CPC ............. *H10K 59/38* (2023.02); *H10K 59/35* (2023.02); *H10K 59/8792* (2023.02); *H10K 59/12* (2023.02)

(58) Field of Classification Search
CPC .... H10K 59/38; H10K 59/35; H10K 59/8792; H10K 59/12; H10K 59/879; H10K 2102/351; H10K 59/50
See application file for complete search history.

(56) References Cited

U.S. PATENT DOCUMENTS

2020/0227486 A1   7/2020 Liu et al.
2020/0312915 A1*  10/2020 Sun ..................... H10K 71/00
(Continued)

FOREIGN PATENT DOCUMENTS

CN          106200100 A      12/2016
CN          106802511 A       6/2017
(Continued)

OTHER PUBLICATIONS

International Search Report in International application No. PCT/CN2021/136427, mailed on Jul. 28, 2022.
(Continued)

*Primary Examiner* — Kevin Quarterman
(74) *Attorney, Agent, or Firm* — PV IP PC; Wei Te Chung (57) ABSTRACT

A display panel and a display device are provided. The display panel includes: a light-emitting unit, including a first sub-light-emitting unit, a second sub-light-emitting unit and a third sub-light-emitting unit adjacent to each other; and a color filter film including a first color resist block located on the first sub-light-emitting unit, a second color resist block located on the second sub-light-emitting unit and a third color resist block located on the third sub-light-emitting unit. A thickness of the first color resist block is different from at least one of a thickness of the second color resist block and a thickness of the third color resist block.

16 Claims, 5 Drawing Sheets

(51) Int. Cl.
  *H10K 59/80* (2023.01)
  *H10K 59/12* (2023.01)

(56) References Cited

U.S. PATENT DOCUMENTS

| | | | |
|---|---|---|---|
| 2021/0233969 A1 | 7/2021 | Sun et al. | |
| 2022/0052298 A1* | 2/2022 | Ge | H10K 59/879 |
| 2022/0140007 A1* | 5/2022 | Yan | H10K 50/865 |
| | | | 257/89 |
| 2022/0302216 A1* | 9/2022 | Hu | H10K 59/8792 |

FOREIGN PATENT DOCUMENTS

| | | |
|---|---|---|
| CN | 108231851 A | 6/2018 |
| CN | 109119453 A | 1/2019 |
| CN | 109659346 A | 4/2019 |
| CN | 110676301 A | 1/2020 |
| CN | 111430567 A | 7/2020 |
| CN | 111613647 A | 9/2020 |
| CN | 111969032 A | 11/2020 |
| CN | 112103328 A | 12/2020 |
| CN | 112216210 A | 1/2021 |
| CN | 112750962 A | 5/2021 |
| CN | 112864205 A | 5/2021 |
| CN | 113078202 A | 7/2021 |
| CN | 113109965 A | 7/2021 |
| CN | 113156689 A | 7/2021 |
| CN | 113745295 A | 12/2021 |
| JP | 2016161870 A | 9/2016 |

OTHER PUBLICATIONS

Written Opinion of the International Search Authority in International application No. PCT/CN2021/136427, mailed on Jul. 28, 2022.
Chinese Office Action issued in corresponding Chinese Patent Application No. 202111441657.8 dated Nov. 24, 2022, pp. 1-9.

* cited by examiner

PRIOR ART

DISPLAY PANEL AND DISPLAY DEVICE

CROSS-REFERENCE TO RELATED APPLICATION

This application is a national phase application under 35 U.S.C. § 371 of PCT Application No. PCT/CN2021/136427 filed Dec. 8, 2021, which claims priority to Chinese Application No. 202111441657.8 filed Nov. 30, 2021, the contents of which are incorporated herein by reference in their entirety.

FIELD OF INVENTION

The application relates to fields of display technologies, in particular to a display panel and a display device.

BACKGROUND OF INVENTION

Polarizer (POL) can effectively reduce the reflectivity of an organic light-emitting diode (OLED) display panel under an external bright light, but the illuminance loses nearly 58%. This greatly increases the life burden of OLED panels.

The use of a color filter film instead of a polarizer is classified as POL-less technologies, which can not only reduce a thickness of a functional layer from 100 microns to 5 microns. Moreover, the illuminance can be increased from 42% to 60%. In OLED panels, R/G/B color resists correspond to the light outputs of R/G/B sub-pixel units, respectively, while the black matrix takes on the role of preventing the light leakage and reducing the reflection of the display panel. In the conventional art, the R/G/B color resists are generally the same, and a black matrix (BM) may block a portion of light of the sub-pixel, especially in a case of large viewing angles, resulting in poor optical characteristics of the display panel.

Technical Problem

The embodiments of the present application provide a display panel and a display device, which can improve the problem of poor optical characteristics of the display panel.

SUMMARY OF INVENTION

Technical Solutions

The embodiments of the present application provide a display panel, including: a light-emitting unit, including a first sub-light-emitting unit, a second sub-light-emitting unit and a third sub-light-emitting unit adjacent to each other; and a color filter film located on the light-emitting unit, the color filter film including a first color resist block, a second color resist block and a third color resist block adjacent to each other, wherein the first color resist block is located on the first sub-light-emitting unit, the second color resist block is located on the second sub-light-emitting unit, and the third color resist block is located on the third sub-light-emitting unit, wherein a thickness of the first color resist block is different from at least one of a thickness of the second color resist block and a thickness of the third color resist block.

In some embodiments, a light-emitting area of the third sub-light-emitting unit is greater than a light-emitting area of the first sub-light-emitting unit, and a light-emitting area of the first sub-light-emitting unit is greater than a light-emitting area of the second sub-light-emitting unit, and the thickness of the first color resist block is greater than at least one of the thickness of the second color resist block and the thickness of the third color resist block.

In some embodiments, a color of the first color resist block and a color of light emitted by the first sub-light-emitting unit are red, a color of the second color resist block and a color of light emitted by the second sub-light-emitting unit are green, and a color of the third color resist block and a color of light emitted by the third sub-light-emitting unit are blue.

In some embodiments, the thickness of the first color resist block and the thickness of the third color resist block are greater than the thickness of the second color resist block.

In some embodiments, the thickness of the first color resist block, the thickness of the second color resist block and the thickness of the third color resist block are all in a range of 2-4 microns.

In some embodiments, after the thickness of the first color resist block, the thickness of the second color resist block and the thickness of the third color resist block are arranged in a descending order, the difference between two adjacent color resist blocks does not exceed 1 micron.

In some embodiments, a transmittance of the first color resist block is less than a transmittance of the second color resist block and a transmittance of the third color resist block, and the transmittance of the first color resist block, the transmittance of the second color resist block and the transmittance of the third color resist block are all in a range of 50%-65%.

In some embodiments, a thickness of an edge of the first color resist block is greater than a thickness of a center point of the first color resist block.

In some embodiments, the color filter film includes a black matrix, the black matrix is provided with a plurality of apertures, the first color resist block, the second color resist block and the third color resist block are respectively at least partially located in a corresponding aperture, a portion of the black matrix close to an edge of the first color resist block is provided with a first absorbing material or a first scattering material to absorb or scatter a color light corresponding to a color of the first color resist block and a color of the first sub-light-emitting unit.

The embodiments of the present application provide a display device, including a display panel as described above.

Beneficial Effect

In the display panel and display device provided by the embodiments of the present application, the thickness of the first color resist block is different from at least one of the thickness of the second color resist block and the thickness of the third color resist block, so that the transmittance of the first color resist block is different from at least one of the transmittance of the second color resist block and the transmittance of the third color resist block. It is a breakthrough in the conventional design that the conventional design configures the transmittances of the first color resist block, second color resist block, and third color resist block to be same. Moreover, it improves the phenomenon that lights with same transmittance tend to diffract and interfere with each other at the black matrix, such that it can balance characteristics of the large viewing angle, holographic color hue and color separation, and improve the optical characteristics of the display panel.

DETAILED DESCRIPTION OF EMBODIMENTS

In order to make the purposes, technical solutions, and effects of the application more clear and explicit, the application is further described in detail below with reference to the attached drawings and examples. It should be understood that the specific embodiments described herein are only used to explain the application and are not used to limit the application.

Figure 1:
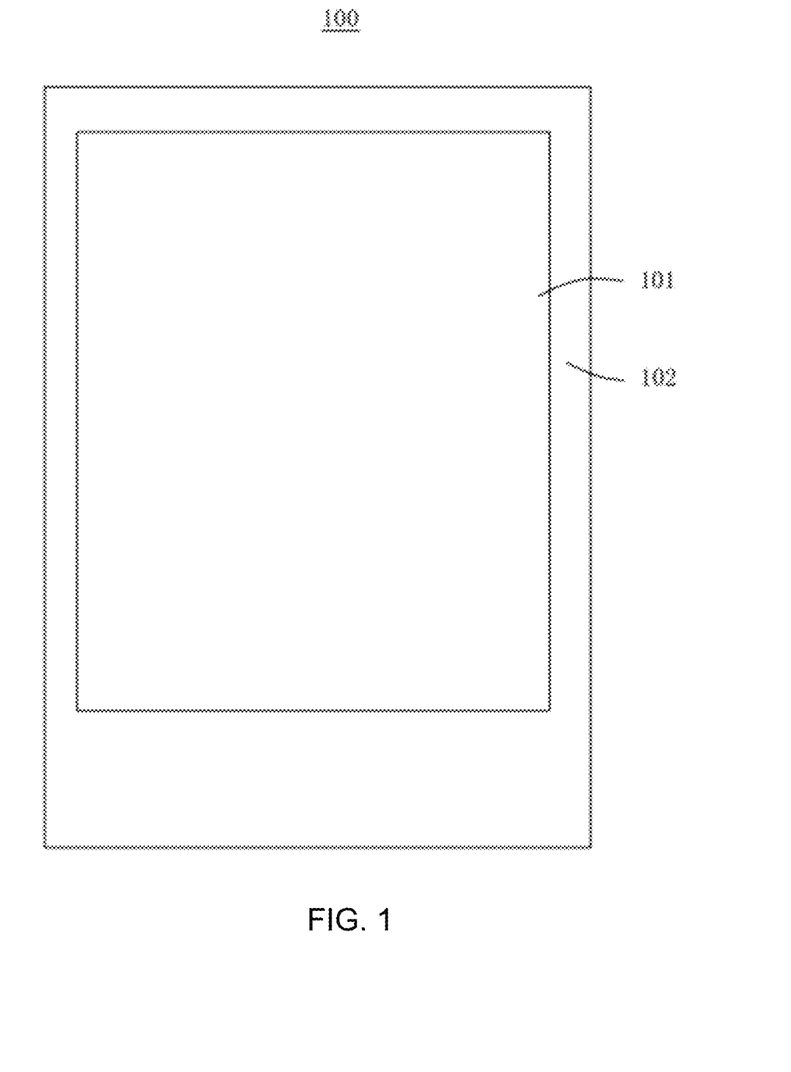
FIG. 1 is a schematic structural view of a display panel provided by an embodiment of the present application.

As shown in FIG. 1, an embodiment of the present application provides a display panel 100 with a display area 101 and a non-display area 102. The display area 101 is used to arrange pixels and pixel driving circuits to achieve light emission, and the non-display area 102 is used to configure peripheral circuits to provide various signals for the pixel driving circuits to achieve light emission control of the pixels. The display panel 100 may be an OLED display panel.

Figure 2:
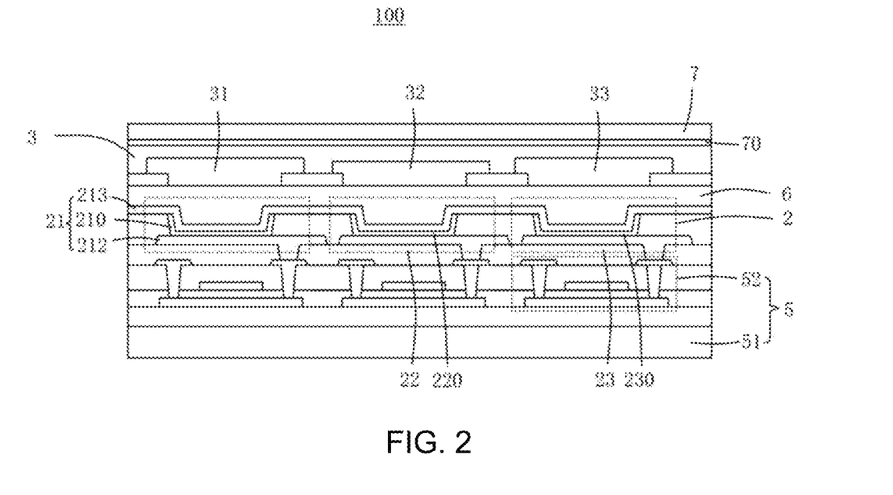
FIG. 2 is a schematic structural view of a display panel provided by an embodiment of the present application.

As shown in FIG. 2, the display panel 100 includes a light-emitting unit 2 and a color filter film 3 located on the light-emitting unit 2. The light-emitting unit 2 is located in the display area 102, and the color filter film 3 is at least located in the display area 102.

The light-emitting unit 2 includes a first sub-light-emitting unit 21, a second sub-light-emitting unit 22, and a third sub-light-emitting unit 23 adjacent to each other. A light emission color of the first sub-light-emitting unit 21, a light emission color of the second sub-light-emitting unit 22 and a light emission color of the third sub-light-emitting unit 23 are all different. In some embodiments, the first sub-light-emitting unit 21, the second sub-light-emitting unit 22, and the third sub-light-emitting unit 23 include a red organic light-emitting material 210, a green organic light-emitting material 220, and a blue organic light-emitting material 230, respectively, which are used for being excited by a current between a cathode 213 and an anode 212 to emit light with a corresponding color. A light-emitting area of the red organic light-emitting material 210 is greater than a light-emitting area of the green organic light-emitting material 220, such that a light-emitting area of the first sub-light-emitting unit 21 is greater than a light-emitting area of the second sub-light-emitting unit 22, and a light-emitting area of the blue organic light-emitting material 230 is greater than the light-emitting area of the red organic light-emitting material 210, such that a light-emitting area of the third sub-light-emitting unit 23 is greater than the light-emitting area of the first sub-light-emitting unit 21.

The color filter film 3 includes a first color resist block 31, a second color resist block 32 and a third color resist block 33 adjacent to each other. The first color resist block 31 is located on the first sub-light-emitting unit 21, the second color resist block 32 is located on the second sub-light-emitting unit 22, and the third color resist block 33 is located on the third sub-light-emitting unit 23. The color of the color resist block is the same as the color of light of the corresponding sub-pixel. A thickness of the first color resist block 31 is different from at least one of a thickness of the second color resist block 32 and a thickness of the third color resist block 33. For example, the thickness of the first color resist block 31 may be equal to the thickness of the third color resist block 33, and both may be greater than the thickness of the second color resist block 32, so that a transmittance of the first color resist block 31 is the smallest of the transmittance of the first color resist block 31, a transmittance of the second color resist block 32 and a transmittance of the third color resist block 33.

In the display panel 100 provided by the embodiments of the present application, the thickness of the first color resist block 31 is configured to be different from at least one of the thickness of the second color resist block 32 and the thickness of the third color resist block 33, so that the transmittance of the first color resist block 31 is different from at least one of the transmittance of the second color resist block 32 and the transmittance of the third color resist block 33. It is a breakthrough in the conventional design that the conventional design configures the transmittances of the first color resist block 31, the second color resist block 32, and the third color resist block 33 to be the same. Moreover, it improves the phenomenon that lights with a same transmittance tend to diffract and interfere with each other at the black matrix 35, such that it can balance characteristics of the large viewing angle, holographic color hue and color separation, and improve the optical characteristics of the display panel 100.

In some embodiments, the thickness of the first color resist block 31, the thickness of the second color resist block 32, and the thickness of the third color resist block 33 are all in a range of 2-4 microns, so that the transmittance of the first color resist block 31, the second color resist block 32, and the third color resist block 33 can be controlled in a range of 50%-65%. Furthermore, after the thickness of the first color resist block 31, the thickness of the second color resist block 32, and the thickness of the third color resist block 33 are arranged in a descending order, the difference between two adjacent color resist blocks does not exceed 1 micron, such that the transmittance of the first color resist block 31, the second color resist block 32, and the third color resist block 33 do not change too much. Therefore, the display panel 100 has a better display effect.

Figure 4A:
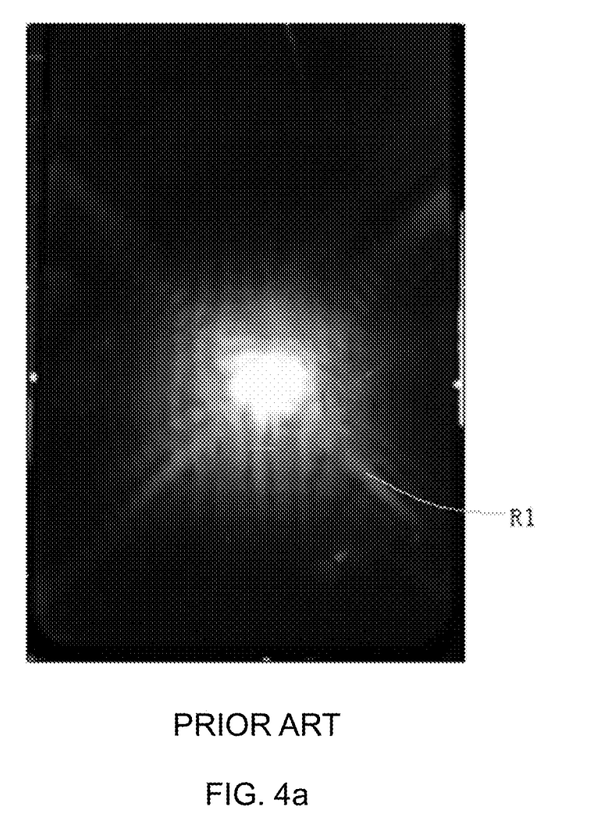
FIG. 4a is an optical effect diagram of a display panel in the conventional art.
Figure 4B:
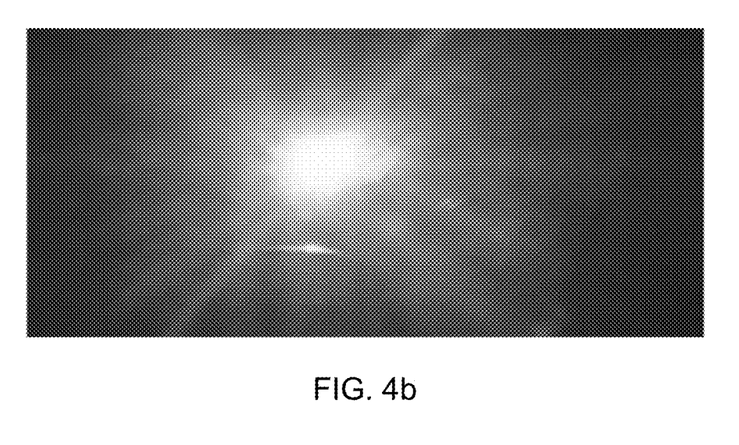
FIG. 4b is an optical effect diagram of a display panel provided by an embodiment of the present application.

In some embodiments, the first color resist block 31 includes a red photoresist material with a thickness of 3.5 microns, and a transmittance of 56%. The second color resist block 32 includes a green photoresist material with a thickness of 3 microns, and a transmittance between 59%-60%. The third color resist block 33 includes a blue photoresist material with a thickness of 3.5 microns, and a transmittance between 59%-60%. As shown in FIG. 4b, in the light emitted by the improved display panel 100, the human eye cannot see the peripheral red light. FIG. 4a is an optical effect diagram of a display panel in which transmittances of color resist blocks are configured to same in the conventional art, it can be clearly seen a peripheral red light R1. It can be concluded that a peripheral red light of the display panel of the embodiments of the present application is suppressed and the color separation phenomenon is improved.

Figure 3:
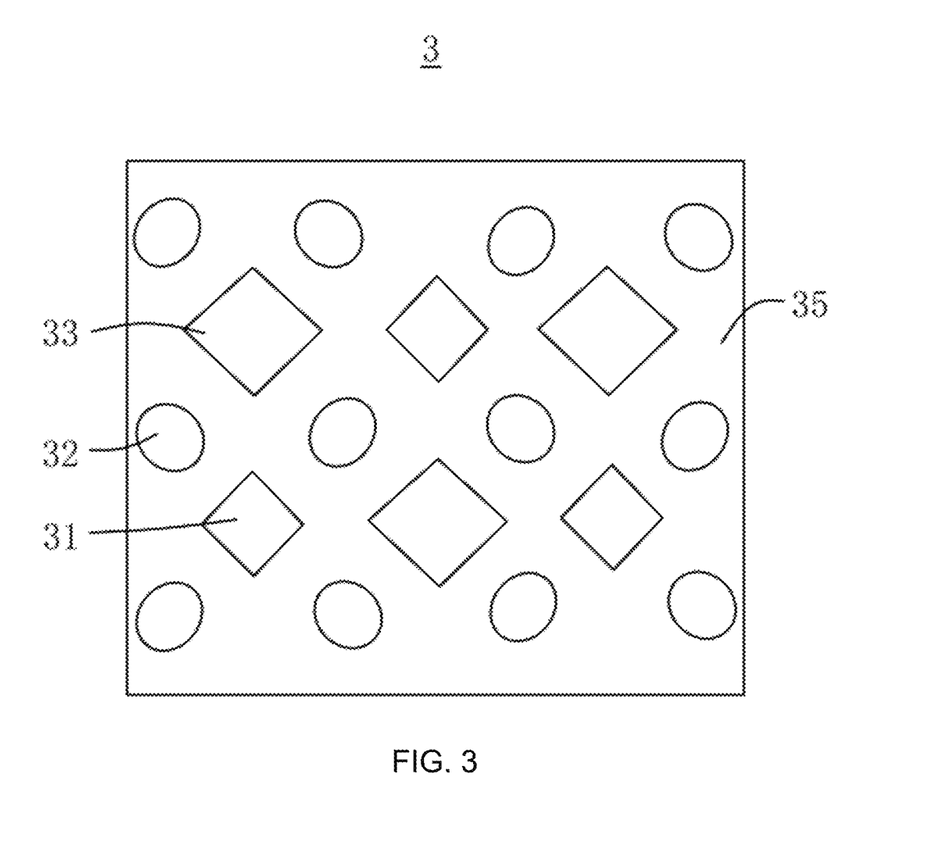
FIG. 3 is a schematic structural view of a color filter film provided by an embodiment of the present application.
Figure 5:
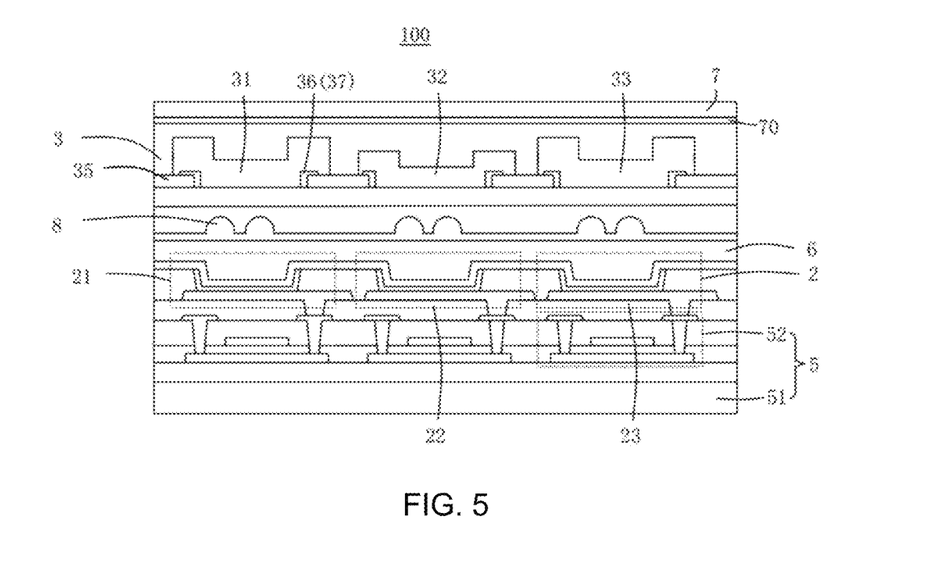
FIG. 5 is a schematic structural view of a display panel provided by an embodiment of the present application.

Referring to FIGS. 3 and 5, in some embodiments, in order to prevent the lights of two adjacent sub-pixels from interfering with each other, the color filter film 3 includes a black matrix 35, the black matrix 35 is provided with a plurality of apertures, and the first color resist block 31, the second color resist block 32 and the third color resist block 33 are at least partially located in a corresponding aperture. An area of the third color resist block 33 is greater than an area of the first color resist block 31, and the area of the first color resist block 31 is greater than an area of the second color resist block 32. A plurality of second color resist blocks 32 are arranged along a row direction and a column direction, and centers of four second color resist blocks 32 are used as vertices to enclose a virtual rectangle. Centers of each first color resist block 31 and each third color resist block 33 is located at a center of a corresponding virtual rectangle. In the row direction and the column direction, the first color resist blocks 31, and the third color resist blocks 33 are arranged at intervals.

In some embodiments, because the light emitted from an edge of the color resist block tends to diffract at the black matrix 35, and thus aggravates the color separation, reducing an amount of light emitted from the edge of the color resist block can improve the color separation phenomenon. Specifically, referring to FIG. 5, a thickness of an edge of the first color resist block 31 is greater than a thickness of a center of the first color resist block 31, which can reduce the light transmittance of the edge of the first color resist block 31.

In some embodiments, because the light emitted from the color resist block tends to diffract at the black matrix 35, and thus aggravate the color separation, reducing an amount of light emitted from the color resist block can improve the color separation phenomenon. Specifically, referring to FIG. 5, a portion of the black matrix 35 close to an edge of the first color resist block 31 is provided with a first absorbing material 36 or a first scattering material 37 to absorb or scatter a color light corresponding to a color of the first color resist block 31 and a color of the first sub-light-emitting unit 21. The scattering material may include acrylic particles or resin particles. The light absorbing material may include a resin material or a metal oxide material such as molybdenum oxide and titanium dioxide.

In some embodiments, because the light emitted from the color resist block tends to diffract at the black matrix 35, and thus aggravate the color separation. Therefore, making as much light as possible emitted vertically from the color resist block can improve the color separation phenomenon. Specifically, referring to FIG. 5, the display panel 100 further includes a lens structure 8, the lens structure 8 includes a first lens, a second lens, and a third lens. The first lens is located between the first color resist block 31 and the first sub-light-emitting unit 21, the second lens is located between the second color resist block 32 and the second sub-light-emitting unit 22, and the third lens is located between the third color resist block 33 and the third sub-light-emitting unit 23. A convergence of the first lens faces toward the first color resist block 31, a convergence of the second lens faces toward the second color resist block 32, and a convergence of the third lens faces toward the first color resist block 31.

Referring to FIG. 2, in some embodiments, the display panel 100 may further include an array substrate 5, an encapsulation layer 6, and a cover plate 7.

The array substrate 5 includes a substrate 51, and a thin-film transistor (TFT) layer 52 located on the substrate 51. The thin-film transistor layer 52 includes a plurality of thin-film transistors electrically connected to the anode 212, to control the light emissions of the first sub-light-emitting unit 21, the second sub-light-emitting unit 22 and the third sub-light-emitting unit 23. In the present embodiment, the material of the substrate 51 may be polyimide.

The encapsulation layer 6 includes a first inorganic layer, an organic layer, and a second inorganic layer stacked in sequence. The first inorganic layer, the organic layer, and the second inorganic layer are located on the first sub-light-emitting unit 21, the second sub-light-emitting unit 22, and the third sub-light-emitting unit 23 to achieve the encapsulation of the first sub-light-emitting unit 21, the second sub-light-emitting unit 22 and the third sub-light-emitting unit 23.

The cover plate 7 is adhered to the color filter film 3 via an optical adhesive 70 to achieve the protection of the color filter film 3. Material of the cover plate 7 may include a glass or a flexible material.

The embodiments of the present application also provide a color filter film 3 as described above.

The embodiments of the present application also provide a display device, including the display panel 100 as described above. The display device may be fixed terminals, such as televisions and desktop computers, mobile terminals, such as smartphones and tablet computers, or wearable devices, such as smartwatches, virtual reality devices, and augmented reality devices.

Specific examples in this description are used to explain the principles and implementations of the application, and the description of the above embodiments are only used to help understand the methods and core ideas of the application. Meanwhile, for those skilled in the art, there will be modifications in the specific implementations and the application scopes according to the concept of the application. In summary, the contents of the specification should not be understood as limitations on the application.

What is claimed is:

1. A display panel, comprising:
   a light emitting unit, comprising a first sub-light-emitting unit, a second sub-light-emitting unit, and a third sub-light-emitting unit adjacent to each other; and
   a color filter film located on the light-emitting unit, the color filter film comprising a first color resist block, a second color resist block and a third color resist block adjacent to each other, wherein the first color resist block is located on the first sub-light-emitting unit, the second color resist block is located on the second sub-light-emitting unit, and the third color resist block is located on the third sub-light-emitting unit,
   wherein a thickness of the first color resist block is different from at least one of a thickness of the second color resist block and a thickness of the third color resist block;
   wherein a light-emitting area of the third sub-light-emitting unit is greater than a light-emitting area of the first sub-light-emitting unit, and a light-emitting area of the first sub-light-emitting unit is greater than a light-emitting area of the second sub-light-emitting unit, and the thickness of the first color resist block is greater than at least one of the thickness of the second color resist block and the thickness of the third color resist block.

2. The display panel according to claim 1, wherein a color of the first color resist block and a color of light emitted by the first sub-light-emitting unit are red, a color of the second color resist block and a color of light emitted by the second sub-light-emitting unit are green, and a color of the third color resist block and a color of light emitted by the third sub-light-emitting unit are blue.

3. The display panel according to claim 1, wherein the thickness of the first color resist block and the thickness of the third color resist block are greater than the thickness of the second color resist block.

4. The display panel according to claim 1, wherein the thickness of the first color resist block, the thickness of the second color resist block and the thickness of the third color resist block are all in a range of 2-4 microns.

5. The display panel according to claim 4, wherein after the thickness of the first color resist block, the thickness of the second color resist block and the thickness of the third color resist block are arranged in a descending order, the difference between two adjacent color resist blocks does not exceed 1 micron.

6. The display panel according to claim 4, wherein a transmittance of the first color resist block is less than a transmittance of the second color resist block and a transmittance of the third color resist block, and the transmittance of the first color resist block, the transmittance of the second color resist block and the transmittance of the third color resist block are all in a range of 50%-65%.

7. The display panel according to claim 1, wherein a thickness of an edge of the first color resist block is greater than a thickness of a center point of the first color resist block.

8. The display panel according to claim 1, wherein the color filter film comprises a black matrix, the black matrix is provided with a plurality of apertures, the first color resist block, the second color resist block, and the third color resist block are at least partially located in a corresponding aperture, a portion of the black matrix close to an edge of the first color resist block is provided with a first absorbing material or a first scattering material to absorb or scatter a color light corresponding to a color of the first color resist block and a color of the first sub-light-emitting unit.

9. A display device, comprising a display panel, wherein the display panel comprises:
- a light-emitting unit, including a first sub-light-emitting unit, a second sub-light-emitting unit, and a third sub-light-emitting unit adjacent to each other; and
- a color filter film located on the light-emitting unit, the color filter film including a first color resist block, a second color resist block and a third color resist block adjacent to each other, wherein the first color resist block is located on the first sub-light-emitting unit, the second color resist block is located on the second sub-light-emitting unit, and the third color resist block is located on the third sub-light-emitting unit,
- wherein a thickness of the first color resist block is different from at least one of a thickness of the second color resist block and a thickness of the third color resist block;
- wherein a light-emitting area of the third sub-light-emitting unit is greater than a light-emitting area of the first sub-light-emitting unit, and a light-emitting area of the first sub-light-emitting unit is greater than a light-emitting area of the second sub-light-emitting unit, and the thickness of the first color resist block is greater than at least one of the thickness of the second color resist block and the thickness of the third color resist block.

10. The display device according to claim 9, wherein a color of the first color resist block and a color of light emitted by the first sub-light-emitting unit are red, a color of the second color resist block and a color of light emitted by the second sub-light-emitting unit are green, and a color of the third color resist block and a color of light emitted by the third sub-light-emitting unit are blue.

11. The display device according to claim 9, wherein the thickness of the first color resist block and the thickness of the third color resist block are greater than the thickness of the second color resist block.

12. The display device according to claim 9, wherein the thickness of the first color resist block, the thickness of the second color resist block and the thickness of the third color resist block are all in a range of 2-4 microns.

13. The display device according to claim 12, wherein after the thickness of the first color resist block, the thickness of the second color resist block and the thickness of the third color resist block are arranged in a descending order, the difference between two adjacent color resist blocks does not exceed 1 micron.

14. The display device according to claim 12, wherein a transmittance of the first color resist block is less than a transmittance of the second color resist block and a transmittance of the third color resist block, and the transmittance of the first color resist block, the transmittance of the second color resist block and the transmittance of the third color resist block are all in a range of 50%-65%.

15. The display device according to claim 9, wherein a thickness of an edge of the first color resist block is greater than a thickness of a center point of the first color resist block.

16. The display device according to claim 9, wherein the color filter film comprises a black matrix, the black matrix is provided with a plurality of apertures, the first color resist block, the second color resist block and the third color resist block are at least partially located in a corresponding aperture, a portion of the black matrix close to an edge of the first color resist block is provided with a first absorbing material or a first scattering material to absorb or scatter a color light corresponding to a color of the first color resist block and a color of the first sub-light-emitting unit.

* * * * *